(12) United States Patent
Kuroda

(10) Patent No.: US 6,751,154 B2
(45) Date of Patent: Jun. 15, 2004

(54) SEMICONDUCTOR MEMORY DEVICE

(75) Inventor: Naoki Kuroda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/400,043

(22) Filed: Mar. 26, 2003

(65) Prior Publication Data

US 2003/0198121 A1 Oct. 23, 2003

(30) Foreign Application Priority Data

Apr. 17, 2002 (JP) ........................................ 2002-115354

(51) Int. Cl.⁷ ................................................. G11C 7/00
(52) U.S. Cl. .............................. 365/230.06; 365/230.05
(58) Field of Search ....................... 365/230.06, 230.05, 365/233, 189.05

(56) References Cited

U.S. PATENT DOCUMENTS

| | | | | | |
|---|---|---|---|---|---|
| 4,916,669 | A | * | 4/1990 | Sato ...................... | 365/230.05 |
| 5,841,727 | A | | 11/1998 | Iwanari et al. .......... | 365/230.03 |
| 6,151,266 | A | * | 11/2000 | Henkels, et al. ........ | 365/230.06 |
| 6,173,356 | B1 | * | 1/2001 | Rao ........................ | 711/5 |
| 6,226,223 | B1 | | 5/2001 | Shirahama et al. ..... | 365/233 |

* cited by examiner

Primary Examiner—Vu A. Le
(74) Attorney, Agent, or Firm—Merchant & Gould P.C.

(57) ABSTRACT

A semiconductor memory device includes: a memory cell configured with two transistors and one capacitor; two word drivers for controlling two word lines alternately, the two word lines controlling reading/writing with respect to the memory cell; two address latch circuits for latching a first address signal to select one of the word drivers, the two address latch circuits being respectively provided upstream from the two word drivers; and an address decoder for decoding a second address signal to generate the first address signal. In this device, the address decoder supplies the first address signal in common to both of the two address latch circuits.

10 Claims, 14 Drawing Sheets

SEMICONDUCTOR MEMORY DEVICE

BACKGROUND OF THE INVENTION

1. Field of the Invention

The present invention relates to a semiconductor memory device, typified by dynamic random access memory (hereinafter abbreviated as DRAM) and the like.

2. Related Background Art

Conventionally, in a semiconductor memory device, especially in DRAM that has a memory cell configured with two transistors and one capacitor for the purpose of realizing a high-speed random operation by two-port accessing the two transistors in an interleave operation mode, addresses are decoded by means of an address latch circuit for latching an address signal, an address decode circuit for decoding an address, a circuit for conducting frequency-division of an address signal into two ports and a control signal for controlling these circuits. Because of this configuration, the conventional semiconductor memory device has a drawback of being incapable of realizing high-speed random accessing. The following describes the conventional semiconductor memory device in detail.

FIG. 14 is a block diagram showing a main configuration of the conventional semiconductor memory device. In FIG. 14, reference numerals 16 and 17 denote an A-port address latch circuit and a B-port address latch circuit, respectively, both of which are configured with: an address control circuit for switching between the fetching of an external address EXTADD and the fetching of a refresh address INTADD; and an address latch circuit for latching the thus fetched address signal.

Reference numeral 18 denotes a peripheral circuit including a circuit for generating a signal controlling these address latch circuits 16 and 17, and 19 denotes a row decoder block that includes an A-port word driver and a B-port word driver for controlling two transistors to access a memory cell.

Reference numeral 9 denotes a command buffer, 10 denotes a command decoder for decoding a command and 11 denotes a frequency-division clock generation circuit for generating a frequency-division clock to control the timing of the decoding of a command.

FIG. 16 is a schematic diagram showing a memory cell and word drivers. In FIG. 16, reference numerals 24 and 25 denote an A-port access transistor and a B-port access transistor respectively. Reference numeral 26 denotes a memory cell capacitor. One terminal of the capacitor 26 is coupled to a cell plate voltage source VCP and the other terminal of the capacitor 26 is commonly coupled to source/drain terminals of the transistors 24 and 25. The other terminals of the transistors 24 and 25 are coupled to an A-port bit line BLA and a B-port bit line BLB respectively. The gate terminals of the transistors 24 and 25 are coupled to an A-port word line WLA and a B-port word line WLB respectively. The transistors 24 and 25, and the capacitor 26 form a memory cell MC. Only one memory cell is shown in the figure. A person skilled in the art, however, would understand that the memory cell MC is repeatedly arranged in rows and columns to form a memory cell array.

Reference numerals 22 and 23 denote an A-port word driver and a B-port word driver respectively. The A-port word driver 22 and the B-port word driver 23 drive an A-port word line WLA and a B-port word line WLB respectively. Only one A-port word driver 22 is shown in the figure. A person skilled in the art, however, would understand that the A-port word driver 22 is repeatedly arranged in the column direction. Similarly, it would be understood that the A-port word line WLA is repeatedly arranged in the column direction. Further, the B-port word driver 23 and the B-port word line WLB are also arranged repeatedly in the column direction.

An address decoding operation by the thus configured semiconductor memory device will be described below, with reference to a timing chart shown in FIG. 15.

With reference to FIG. 15, firstly in cycle A, when a read operation (READ command) is carried out as an external access, an address signal A0 input from an external input ADD is latched by a latch circuit in an address buffer 7 to be synchronized with an external clock signal CLK and is transferred to the A-port address latch circuit 16 as an internal address signal EXTADD0. During this procedure, the command READ input from an external input CMD is latched by the command buffer 9 to be synchronized with the external clock signal CLK and then is decoded into an internal signal by the command decoder 10.

Then, using the thus decoded command signal and a frequency-division clock signal ACLK/BCLK generated from the external clock CLK by the frequency-division clock generation circuit 11, a command control signal ACTA/ACTB subjected to the frequency-division is generated. This control signal ACTA/ACTB is used for conducting frequency-division of the internal address signal EXTADD0 into an A-port address signal PDA in the A-port address latch circuit 16, which is transferred to a row address decoder 20.

Thereafter, the address signal PDA is rendered into an address decode signal PDDA by the row address decoder 20. Then, the address decode signal PDDA activates a desired A-port word driver 22 and activates an A-port memory cell transistor to access a desired memory cell capacitor.

Next, the address in the cycle A is reset. More specifically, the address signal PDA and the address decode signal PDDA are reset by resetting the address buffer 7 and the A-port address latch circuit 16 after a period of the frequency-division has passed, so that the A-port word driver 22 is reset.

However, the above-stated configuration has the following problems: that is, when setting an address signal in the above device, the address buffer 7 firstly is used for latching the address signal according to the external clock signal CLK. In addition, according to the control signal ACTA/ACTB, which starts at a later timing than the external clock CLK, the address signal EXTADD is allocated into one of the latch circuits so as to be latched and then decoded. Due to this configuration, it takes a long time to set the address signal, so that the random access cannot be speeded up further.

Also, since the address signal is divided into two lines at the A-port address latch circuit 16 and the B-port address latch circuit 17, two sets of circuits are required for the later stages also, which causes problems of an increase in circuit area and an increase in address bus that is arranged on the row decoder.

Moreover, the address signal is reset in such a manner that after the A-port address latch circuit 16 or the B-port address latch circuit 17 is reset, the row address decoders 20 and 21 are reset and the word drivers 22 and 23 are reset. Due to this configuration, it takes a long time to, in particular, precharge a long address decode signal PDDA/PDDB on the row address decoders, which hinders the speedup of the random cycle.

SUMMARY OF THE INVENTION

Therefore, with the foregoing in mind, it is an object of the present invention to provide a semiconductor memory device that can realize fast random access, while reducing a device area.

In order to fulfill the above-stated object, the semiconductor memory device according to the present invention includes: a memory cell including two transistors and one capacitor; two word drivers for controlling two word lines alternately, the two word lines controlling reading/writing with respect to the memory cell; two address latch circuits for latching a first address signal to select one of the word drivers, the two address latch circuits being respectively provided upstream from the two word drivers; and an address decoder for decoding a second address signal to generate the first address signal. The address decoder supplies the first address signal in common to both of the two address latch circuits.

With this configuration, the address is not latched until an external input is conducted and the address is decoded. That is to say, during a time period for generating a control signal for latching inside of the device, the address can be decoded by utilizing a time period for the set-up of the address. Therefore, the time required for address setting can be reduced as a whole.

In addition, since this device is configured so that one address decoder is included and frequency-division is conducted into two lines by the address latch circuits provided downstream, the number of address decoders and the number of address busses can be reduced by half, so that the layout area can be reduced significantly.

Preferably, in the semiconductor memory device according to the present invention, the two address latch circuits are placed in a row decoder block in which the two word drivers are arranged with a fixed interval from the memory cell. This is because by placing the address latch circuits in the row decoder in which the word drivers are arranged, the number of long address buses arranged on the row decoder can be reduced by half as compared with the prior art, and the layout area can be reduced.

In addition, by placing the address latch circuits in the low decoder and by selectively activating a word driver or a word driver block to be activated by a latch control signal for controlling the address latch circuits, power consumption can be reduced.

Preferably, in the semiconductor memory device according to the present invention, a control signal for controlling execution of latching by the two address latch circuits is determined as a result of logical multiplication of an internal signal for executing an external command and a control signal obtained from frequency-division of an external clock signal for controlling two ports of the semiconductor memory device alternately. This configuration is preferable because the address bus can be fixed when an external command is not input, whereby power consumption can be suppressed.

Preferably, in the semiconductor memory device according to the present invention, a control signal for controlling execution of latching by the two address latch circuits is determined as a result of logical multiplication of the internal signal for executing an external command, the control signal obtained from frequency-division of an external clock signal for controlling two ports of the semiconductor memory device alternately and an address decode signal indicating a memory cell block in an array of the memory cell. This configuration is preferable because by determining an output signal as a result of logical multiplication, the level of the activated address signal only is changed during a specific time period only, so that the two address latch circuits provided downstream can be controlled easily, thus avoiding a latch error.

Preferably, in the semiconductor memory device according to the present invention, the control signal for controlling execution of latching by the two address latch circuits is input into the address latch circuits, which are divided corresponding to a memory cell block. This configuration is preferable because by arranging so that the latch control signal can be input for every specific memory cell blocks, especially in the case of a large-capacity memory configuration, a load of the latch control signal can be reduced, which is effective for speeding up the address latching.

Preferably, the semiconductor memory device according to the present invention, further includes a timing adjustment circuit in the row decoder block in which the address latch circuits are placed, the timing adjustment circuit being provided for the control signal for controlling execution of latching by the two address latch circuits and provided for every specific number of memory cell blocks. This configuration is preferable because by providing the timing adjustment circuit for every specific number of memory cell blocks, a latch error in the address latch circuits in the row decoder, which is caused by, for example, a delay in the address signal due to the interference in long address busses, can be avoided.

Preferably, the semiconductor memory device according to the present invention further includes a latch circuit provided between the address decoder and the two address latch circuits, wherein the latch circuit latches the first address signal during a time period only when the external clock signal is in a high state. This configuration is preferable because especially in a semiconductor memory device operating at high frequencies, where an address data confirming time period (i.e., set-up+ holding time period) is short, an address signal can be confirmed by the latch circuit until the external clock becomes in a high state, thus avoiding a latch error in the address latch circuits provided downstream.

Preferably, in the semiconductor memory device according to the present invention, the latch circuit further includes a function for resetting the first address signal during a time period when the external clock signal is in a low state. This configuration is preferable because a random cycle time period can be speeded up and the address bus can be fixed during a unconfirmed time period of an address signal, thus suppressing power consumption.

Preferably, in the address decoder of the semiconductor memory device according to the present invention, an address decode signal is determined as a result of logical multiplication with a control signal for controlling latching by the address latch circuits. This configuration is preferable because the address bus can be fixed when an external command is not input, whereby power consumption can be reduced.

Preferably, in the address decoder of the semiconductor memory device according to the present invention, the first address signal is determined as a result of logical multiplication with an internal signal for executing an external command, and a control signal for controlling execution of latching by the address latch circuits is determined as a result of logical multiplication with a control signal obtained from frequency-division of an external clock signal for controlling two ports of the semiconductor memory device alternately.

With this configuration, an address decode signal latched by the address latch circuits becomes only a normalized address for accessing the memory access after the input of an external command. In addition, by determining an output signal as a result of logical multiplication, the level of the activated address signal only is changed during a specific time period only, so that the two address latch circuits provided downstream can be controlled easily, and a latch error can be avoided. Moreover, the pre-charge of the address bus can be speeded up and power consumption can be reduced.

DETAILED DESCRIPTION OF THE INVENTION

The following describes semiconductor memory devices according to embodiments of the present invention, with reference to the drawings. The following embodiments will be described assuming that the semiconductor memory device is, for example, DRAM having a memory cell configured with two transistors and one capacitor.

Embodiment 1

Figure 1:
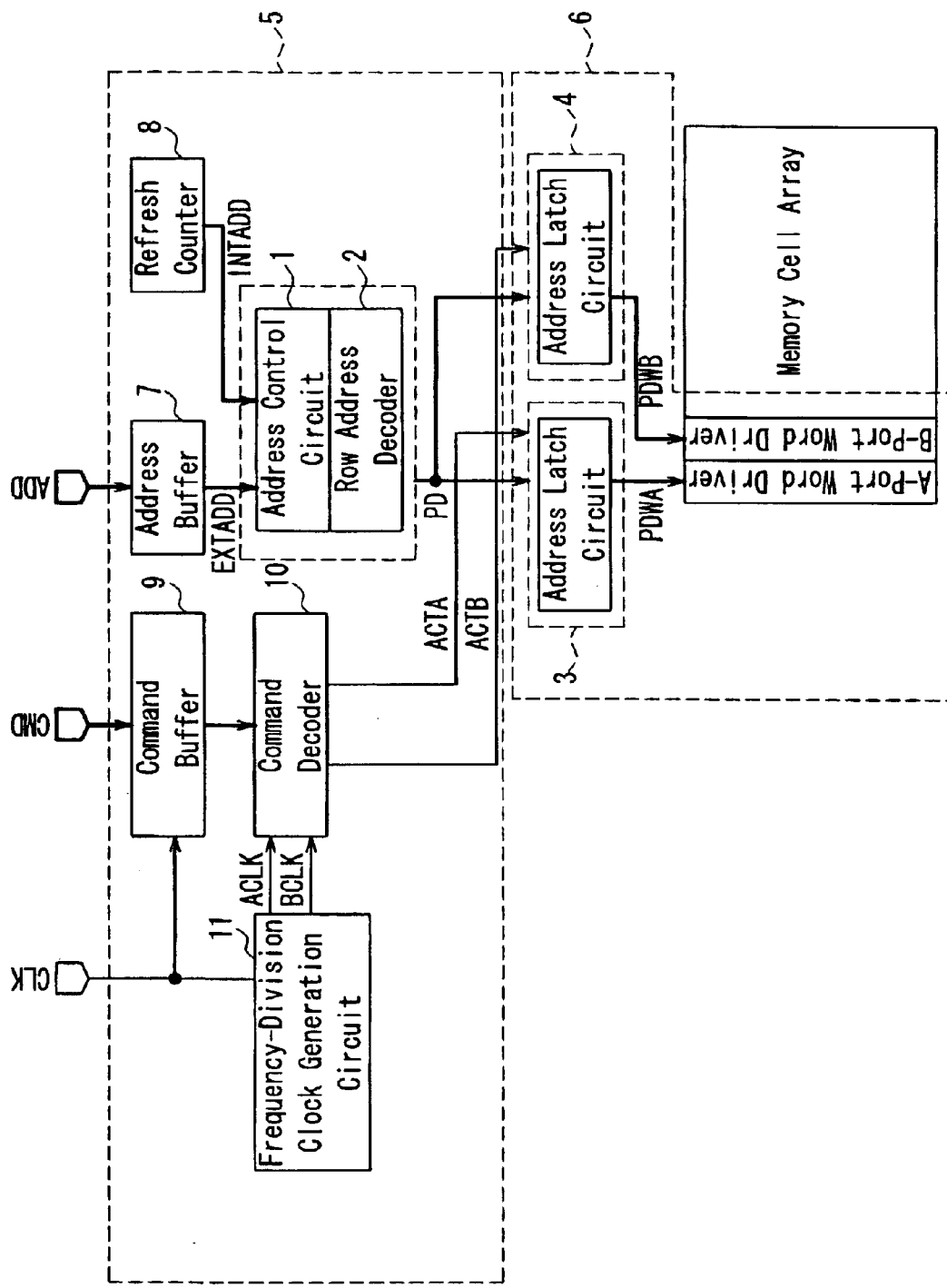
FIG. 1 is a block diagram showing a main configuration of the semiconductor memory device according to Embodiment 1 of the present invention.
Figure 2:
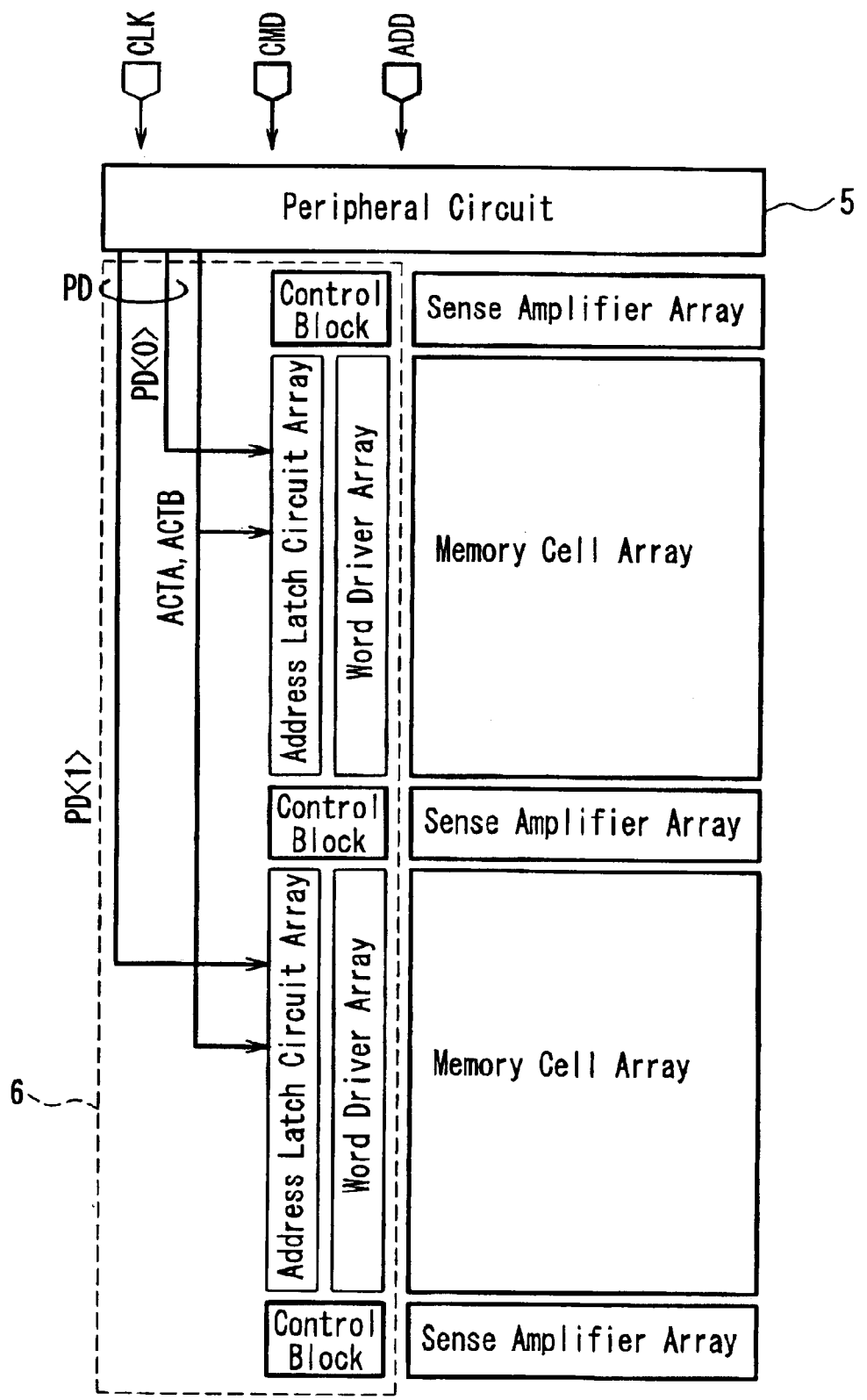
FIG. 2 is another block diagram showing the main configuration of the semiconductor memory device according to Embodiment 1 of the present invention.

A semiconductor device according to Embodiment 1 of the present invention will be described below, with reference to the drawings. FIG. 1 is a block diagram showing a main configuration of the semiconductor memory device according to Embodiment 1 of the present invention. FIG. 2 is a block diagram roughly showing an actual layout of the configuration shown in FIG. 1.

FIG. 1 shows the semiconductor memory device that operates in synchronization with an external clock. Reference numeral 1 denotes an address control circuit for switching between the fetching of an external address EXTADD from an address buffer 7 and the fetching of a refresh address INTADD from a refresh counter 8, and 2 denotes a row address decoder for decoding the thus fetched row address signal.

Reference numerals 3 and 4 denote an A-port address latch circuit and a B-port address latch circuit, respectively, for latching a row address decode signal PD according to a frequency-division period to allow an interleave operation between the two ports.

Also, in FIGS. 1 and 2, reference numeral 5 denotes a peripheral circuit including a control circuit for controlling the row address decoder 2 and the address latch circuits 3 and 4 shown in FIG. 1, 6 denotes a row decoder block including the address latch circuits 3 and 4 and an A-port word driver and a B-port word driver for controlling two transistors included in a memory cell that is configured with the two transistors and one capacitor.

Reference numeral 9 denotes a command buffer, 10 denotes a command decoder for decoding a command and 11 denotes a frequency-division clock generation circuit for generating a frequency-division clock to control a timing of the decoding of a command.

Figure 3:
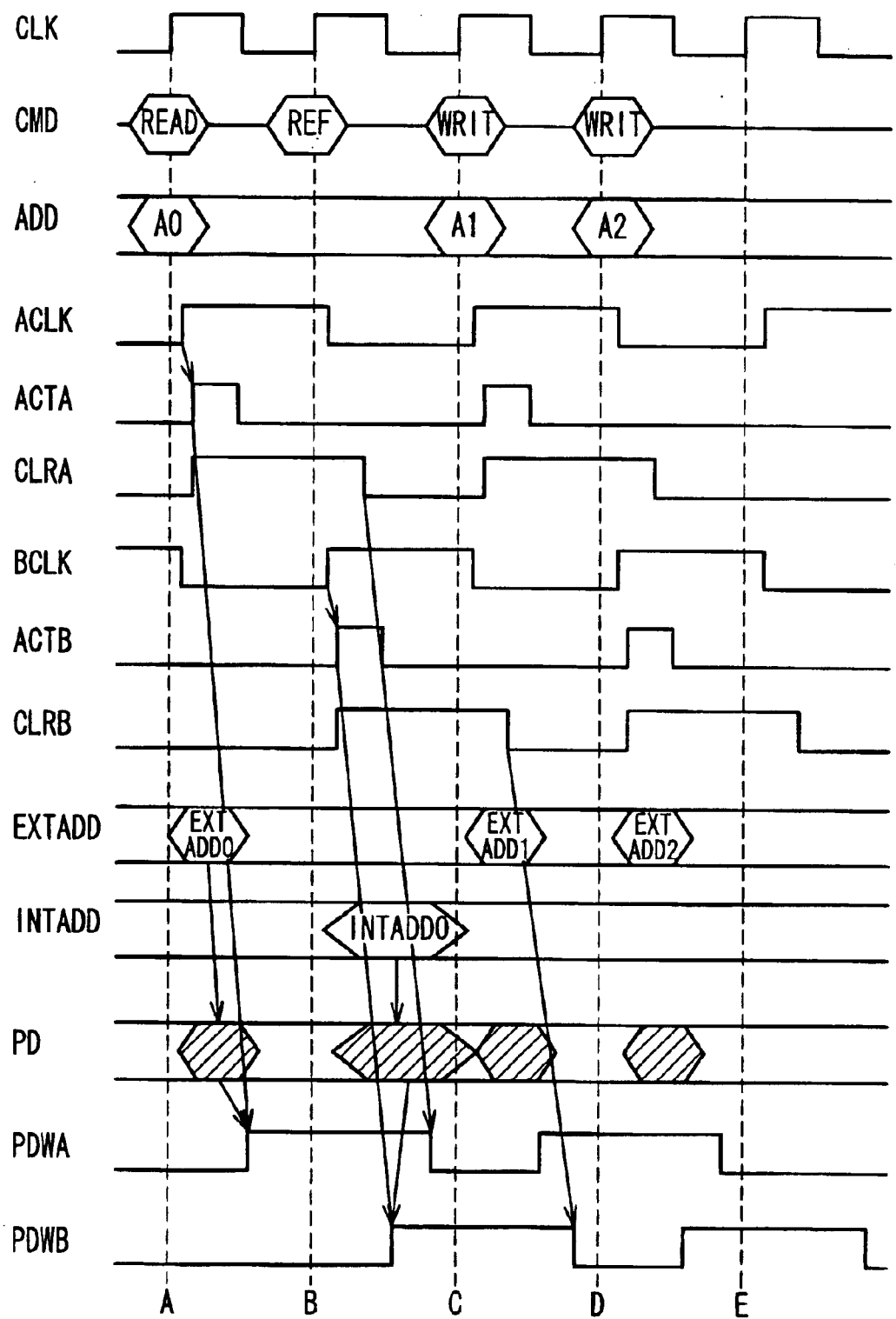
FIG. 3 is a timing chart showing the main configuration of the semiconductor memory device according to Embodiment 1 of the present invention.

As for the semiconductor memory device with the above-described configuration, the following mainly describes a row address decoding operation by the same, with reference to FIGS. 1 to 3.

With reference to FIG. 3, firstly in cycle A, data in an address A0 is read out in response to the input of an external command READ and the external address A0. As is well known, a semiconductor memory device may be provided with a memory cell including two transistors and one capacitor for the purpose of a high-speed operation by dividing an internal circuit into two ports to carry out an interleave operation. Relating to this procedure, a reference signal allows the internal two ports to be controlled according to the frequency-division period. In this embodiment, ACLK and BCLK generated in the frequency-division dock generation circuit 11 correspond to the reference signal, where ACLK is used for the control in cycle A.

A control signal generated in response to the ACLK and a command READ for reading-out, which is decoded by the command decoder, is ACTA, and the control signal ACTA functions as a control signal for latching an address in the A-port address latch circuit 3.

Next, the external address signal A0 input from an external pad ADD is buffered in the address buffer 7 and is rendered into an internal address decode signal PD by the row address decoder 2. Such an address decode signal PD is latched for the first time in the A-port address latch circuit 3 by the activated control signal ACTA so as to be rendered into an address latch signal PDWA. Then, by activating a desired A-port word driver, data is read out from the memory cell.

The address latch signal PDWA that is latched by the A-port address latch circuit 3 is kept latched during the frequency-division period extending to cycle B. The latch of the address latch signal PDWA is reset by a reset signal CLRA.

Next, in cycle B, a refresh operation is conducted by an external command REF and an internal refresh address INTADD. The operation in this procedure is a periodic operation according to a frequency-division period where BCLK functions as a reference signal, and the same operations as in the cycle A are conducted. That is to say, an address decode signal PDWB activates a desired B-port word driver so as to refresh the memory cell.

As for a writing operation WRIT in cycles C and D also, a word driver activating operation is conducted in the same manner as in the read-out operation in cycle A, where an interleave operation is conducted while ACLK and BCLK function as the reference in the respective cycles.

As described above, the device is configured so that in the row address decoding operation from the input of an command to the activation of the memory cell transistor, the address is not latched until the address is decoded. That is to say, the address latch circuits 3 and 4 are placed downstream from the address decoder 2 so that generation of a control signal for the address latch circuits 3 and 4 and decoding of an address are simultaneously performed. With this configuration, during a time period for generating the control signal for latching, an address can be decoded by utilizing a time period for the set-up of the address. Therefore, the row address decoding operation can be speeded up by this time period for the set-up. In practice, when this configuration is applied to a 0.15 μm process, the random accessing can be speeded up by approximately 30%.

In addition, since the row address decode signal PD is distributed in common to the two address latch circuits, the number of address buses arranged on the row decoder block 6 can be reduced by half as compared with the prior art, and therefore this configuration is effective in terms of the reduction in layout area also.

Furthermore, only one row address decoder 2 is enough, and therefore control signals and the like required for controlling such a circuit also can be reduced by half. As a result, a layout area of the peripheral circuit 5 also can be reduced significantly.

Moreover, as for the wiring functioning as a path of an address signal on the row decoder block 6, especially in the case of a large memory capacity, the wiring length would increase, resulting in an increase in load of the transmission. According to the above-described configuration, however, by latching the address decode signal PD on the row decoder block 6 by the address latch circuit 3 or 4, the address bus can be rendered into a pre-charge state. As a result, the shift to the next cycle operation can be carried out at high speed in the heavy-load signal line, and therefore this configuration can realize the high-speed random cycle operation.

Figure 4:
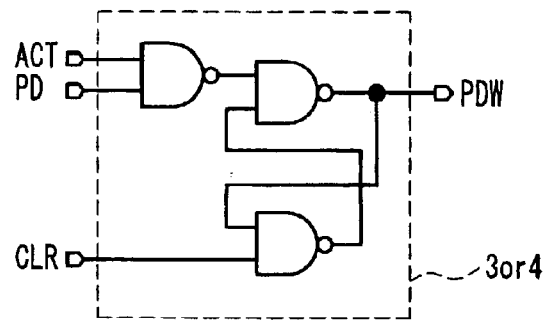
FIG. 4 is a block diagram showing a circuit in the semiconductor memory device according to Embodiment 1 of the present invention.

FIG. 4 shows an example of a specific circuit that constitutes the address latch circuit 3 or 4 shown in FIG. 1. As shown in FIG. 4, when the control signal ACT, which is generated by combining the external command signal CMD and a frequency-division signal from the external clock signal CLK, is activated, the address decode signal PD is latched so as to activate the address latch signal PDW. Meanwhile, the address is reset by a reset signal CLR.

Therefore, by using as the latch control signal ACT a control signal generated by combining the external command signal CMD and a frequency-division signal from the external clock signal CLK, the circuit placed downstream from this circuit can conduct a 2-port interleave operation properly.

Figure 5:
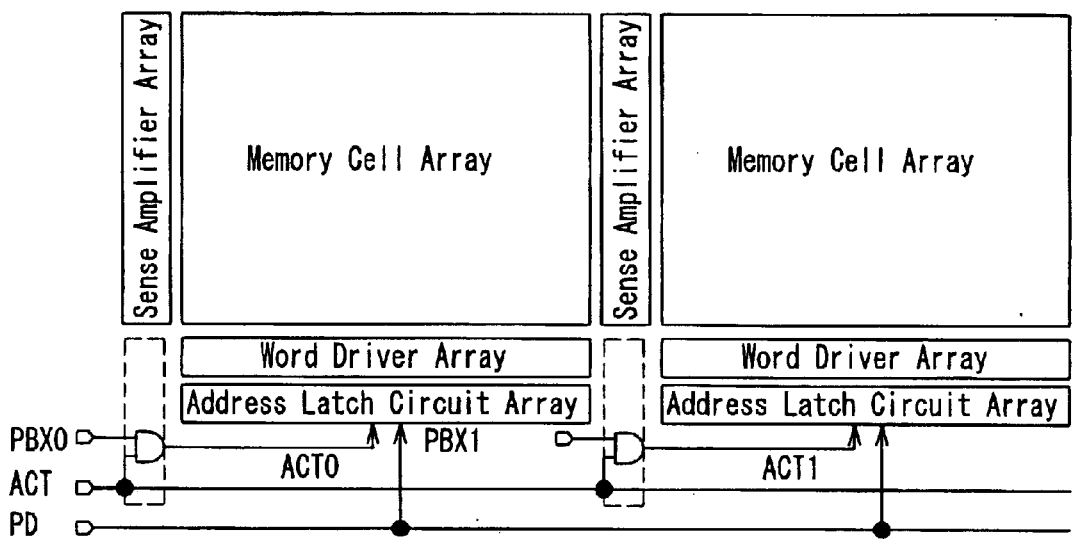
FIG. 5 is a block diagram showing another semiconductor memory device according to Embodiment 1 of the present invention.

As shown in FIG. 5, another configuration can be considered in which the control is conducted using a control signal ACT0 or ACT1, which are determined as a result of logical multiplication of the latch control signal ACT and, for example, an address decode signal PBX0 or PBX1 of an address indicating a memory cell block. With this configuration, the latch control signal can have a hierarchical structure and a load of the latch control signal can be reduced, and therefore the row address decoding operation further can be speeded up.

Still another configuration can be considered, in which the wiring is configured so that the latch control signal ACT is input for each address latch circuit that is connected to a specific memory cell block unit. This configuration becomes effective for speeding-up of the row address decoding operation, especially when the capacity of the memory cell is large. That is, although a load of the wiring for the latch control signal ACT and a load of the gate in the address latch circuit increase, the same wiring can be divided optimally.

Figure 6:
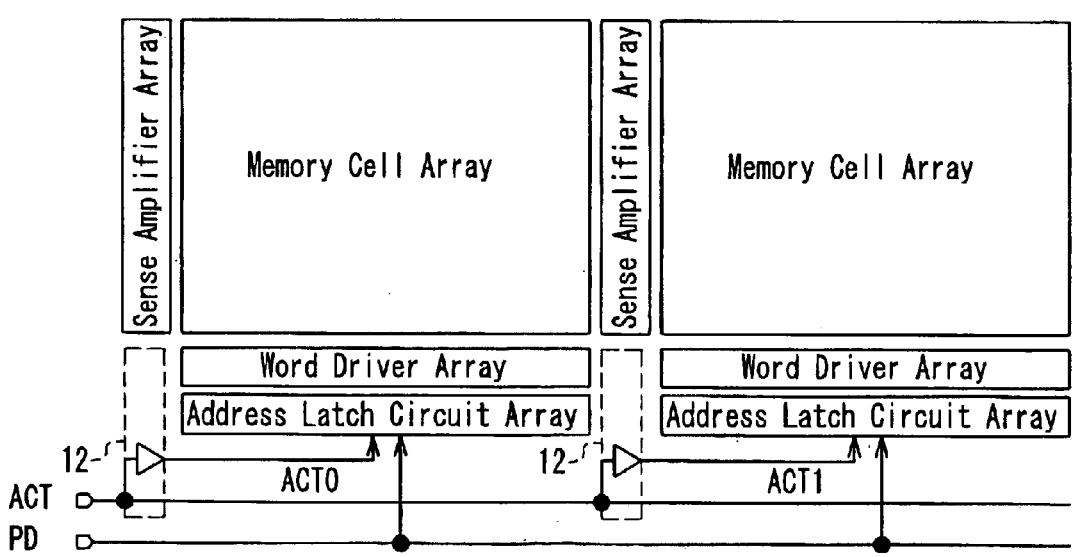
FIG. 6 is a block diagram showing still another semiconductor memory device according to Embodiment 1 of the present invention.

FIG. 6 shows a configuration where a timing adjusting circuit 12 is provided for each specific memory cell block. Especially in the high frequency operation, a semiconductor memory device with a large memory cell capacity might suffer from skew in the address signal because of the interference noise among the address buses running on the row address and a problem concerning a load of the wiring. Due to the skew, a time-lag occurs between the timing of the latch control signals ACTA and ACTB in the address latch circuits 3 and 4, which prevents the address latch circuits 3 and 4 from correctly latching the address. On the other hand, with the arrangement of the timing adjusting circuit 12 provided individually for each memory block, the above-described latch error can be avoided.

Note here that, needless to say, a larger effect can be obtained by combining the above-described configurations.

Embodiment 2

Figure 7:
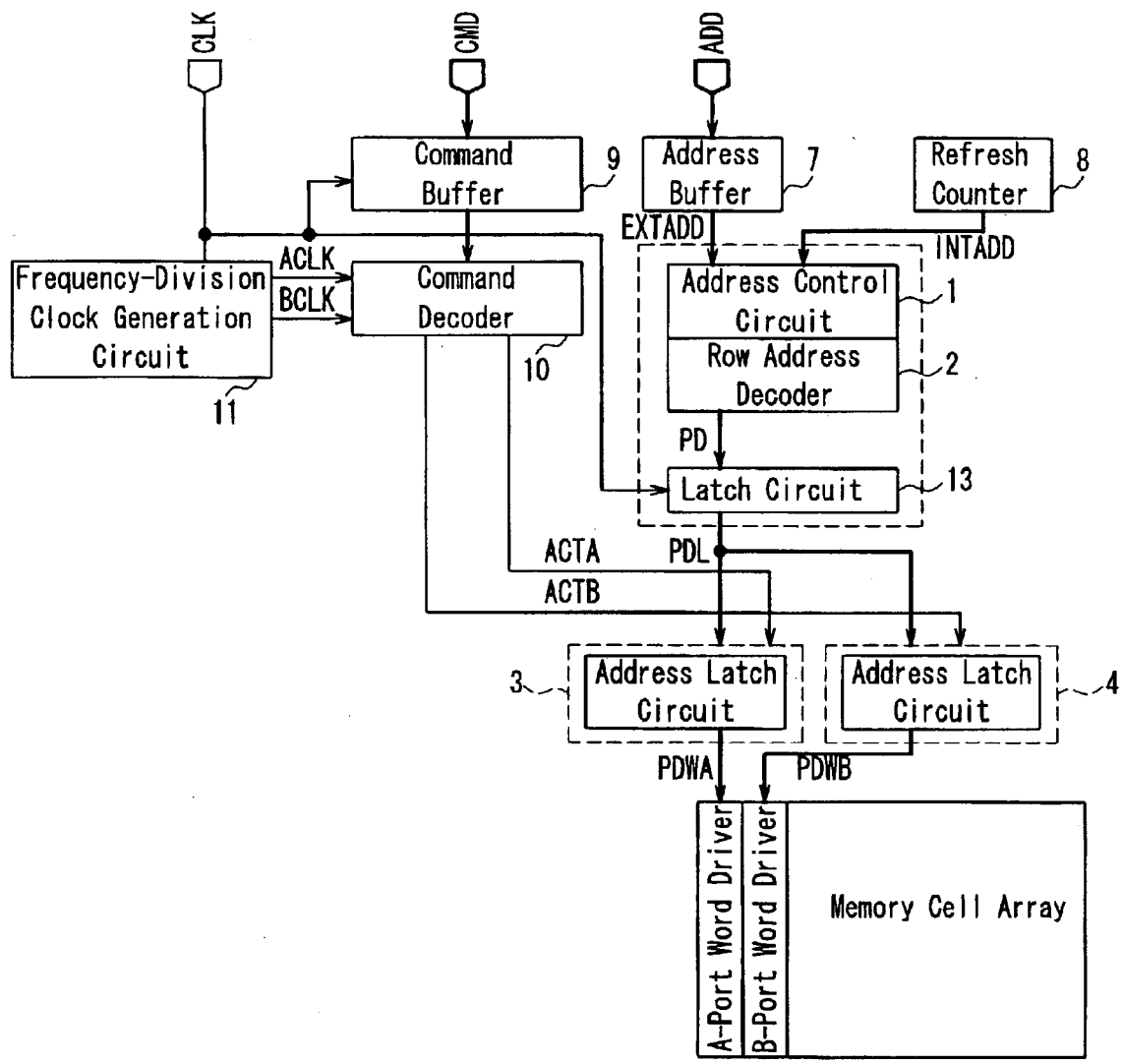
FIG. 7 is a block diagram showing a main configuration of the semiconductor memory device according to Embodiment 2 of the present invention.

The following describes a semiconductor device according to Embodiment 2 of the present invention, with reference to the drawings. FIG. 7 is a block diagram showing a main configuration of the semiconductor memory device according to Embodiment 2 of the present invention. In FIG. 7, reference numeral 13 denotes a row address latch circuit for latching an address decode signal PD, which is decoded by a row address decoder 2, by a signal in synchronization with an external clock signal CLK.

Figure 8:
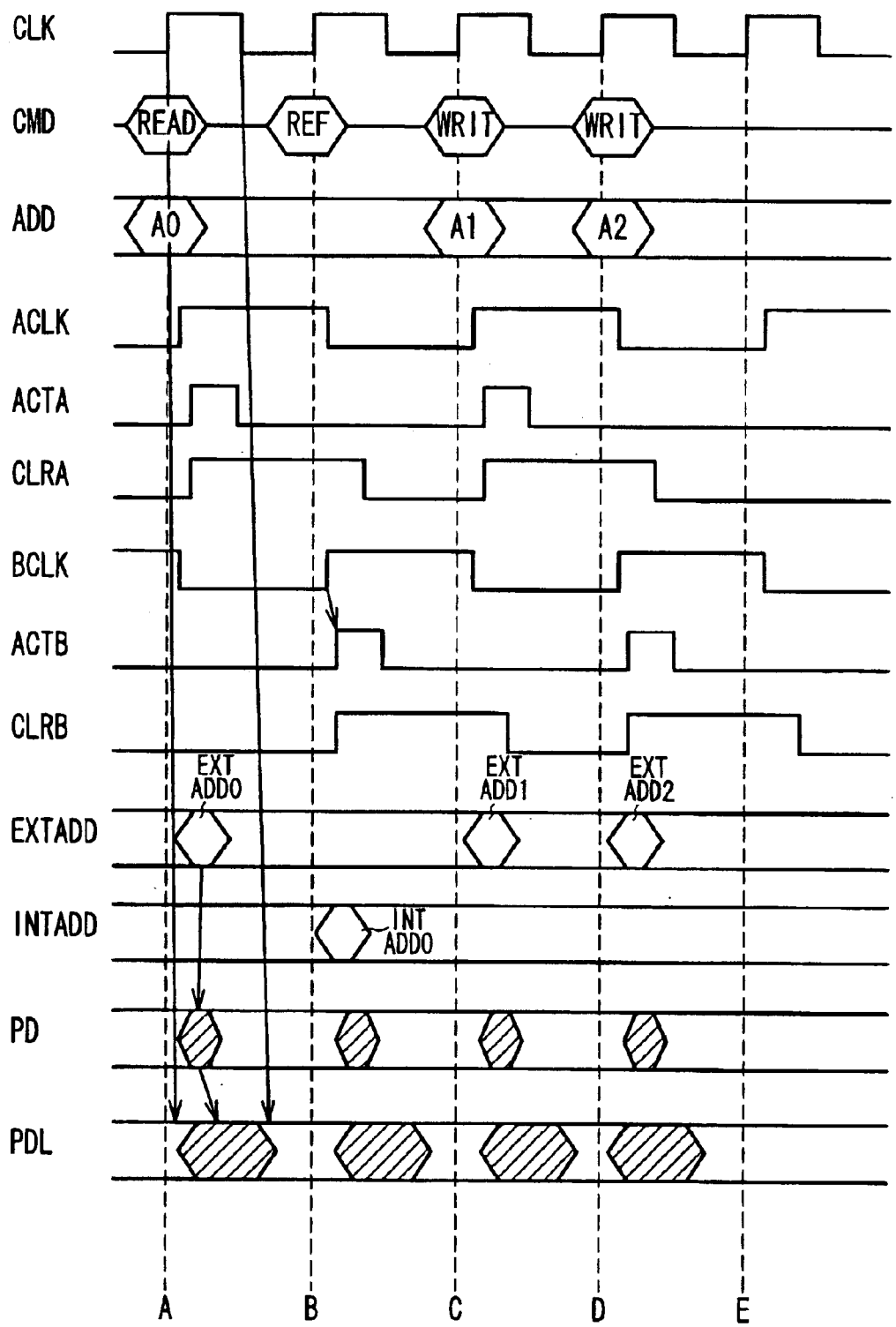
FIG. 8 is a timing chart showing the main configuration of the semiconductor memory device according to Embodiment 2 of the present invention.

As for the semiconductor memory device with the above-described configuration, the following mainly describes a row address decoding operation by the same, with reference to FIGS. 7 and 8.

In FIG. 8, data in an address A0 is read out in response to the input of an external command READ and an external address A0. Relating to this procedure, a reference signal for controlling the internal two ports according to the frequency-division period is ACLK and BCLK generated in the frequency-division clock generation circuit 11, where ACLK is used for the control in cycle A.

A control signal for controlling the ACLK and a command READ for reading-out that is decoded by the command decoder is ACTA, and the control signal ACTA functions as a control signal for latching an address in the A-port address latch circuit 3.

Next, the external address signal A0 input from an external pad ADD is buffered in the address buffer 7 and is rendered into an internal address decode signal PD by the row address decoder 2. Such an address decode signal PD is latched in the row address latch circuit 13 that is placed downstream. In this procedure, an address holding period in the row address latch circuit 13 is set at a time period when the external clock CLK is in a high state, and therefore an address latch signal PDL is valid during a period in which the external clock CLK is in a high state.

In the following cycles B, C and D also, the same row address decoding operation is conducted.

In general, especially in a semiconductor memory device operating at high frequencies, the disorder of the wave shapes of the address decode signal occurs when an external-address-valid time period (i.e., set-up+holding time period) is short, a load of the address decode signal on the row decoder is heavy because of a large memory cell capacity, or an operating power-supply voltage is low. However, by holding the address decode signal PD in the latch circuit 12 during a time period when the external clock CLK is in a high state, the reduction in the address-valid time period, which is caused by the disorder of the wave shapes of the address decode signal, can be avoided, and moreover the latch error in the address latch circuits 3 and 4 can be avoided by extending the address-valid period.

In addition, the address signal ADD confirms an address earlier than the external clock CLK by the set-up time period. Therefore, by placing the row address latch circuit 13 downstream from the row address decoder 2, enough time can be secured from the decoding by the row address decoder 2 to the transferring to the row address latch circuit 13. As a result, a high-speed row address decoding operation becomes possible without interfering with the address setting operation.

Note here that although Embodiment 2 adopts the time period when the external clock signal is in a high state, needless to say, one period may be adopted because it can also secure the address-valid time period.

Figure 9:
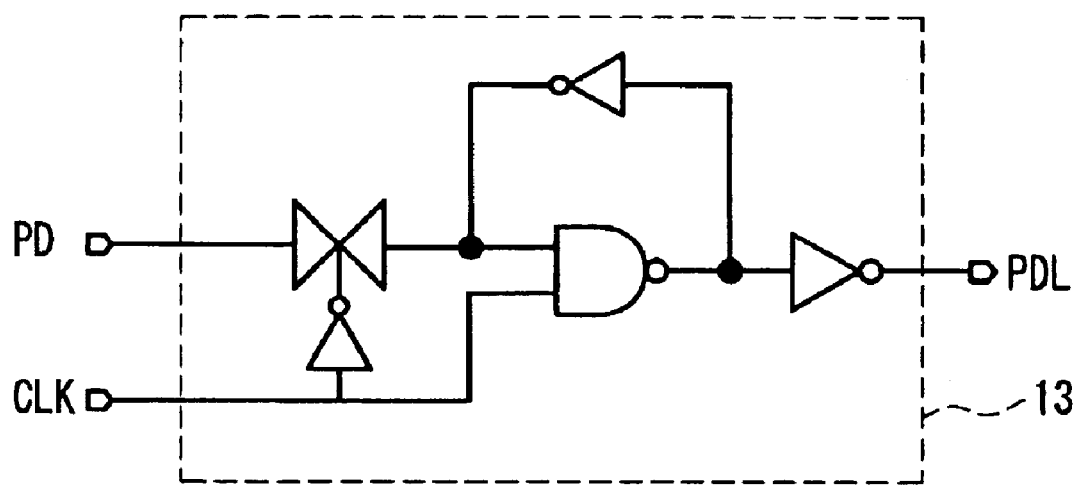
FIG. 9 is a block diagram showing a circuit in the semiconductor memory device according to Embodiment 2 of the present invention.

FIG. 9 shows an example of a specific circuit that constitutes the row address latch circuit 13 shown in FIG. 7. As shown in FIG. 7, the address decode signal PD is held during a time period when the external clock signal CLK is in a high state to function as the address latch signal PDL. Whereas, during a time period when the external clock signal CLK is in a low state, the address latch signal PDL also becomes in a low state. That is to say, the time period when the external clock signal is in a high state is set as the address-valid time period, whereas the time period when the external clock signal CLK is in a low state is set as the address fixing time period (low data).

As described above, the configuration in this embodiment is effective for extending the address-valid time period. Additionally, the configuration has the following advantages: that is, according to this configuration, an address bus with a heavy load can be fixed for the address input during the invalid time period of the external address, so that an influence on the other signal lines arranged on the row decoder can be minimized. Also, this configuration is effective for reducing power consumption by virtue of the suppression of charge/discharge of the bus lines. Moreover, by fixing the address data during the address-invalid time period, the address latch circuit positioned downstream can be controlled easily.

Figure 10:
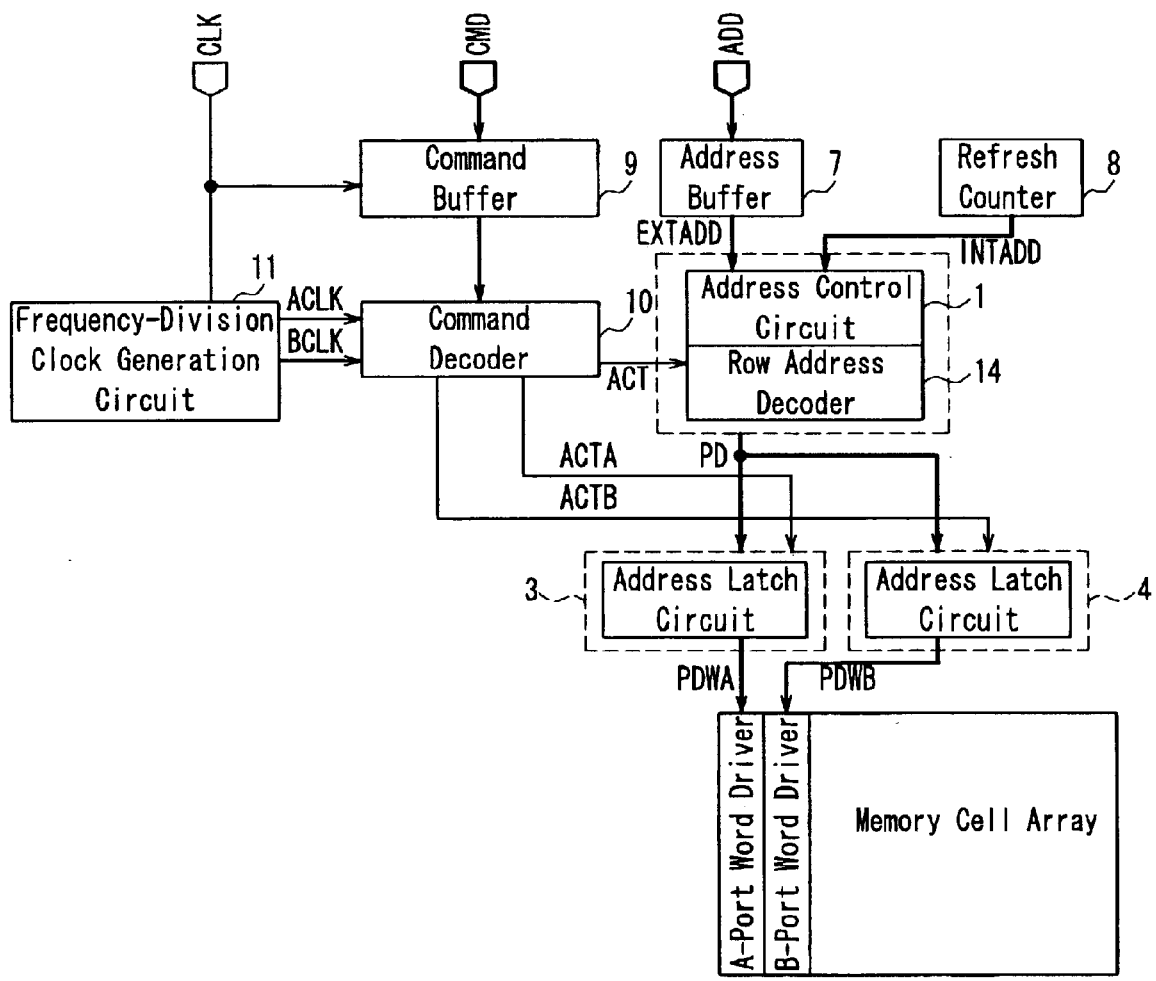
FIG. 10 is a block diagram showing a main configuration of another semiconductor memory device according to Embodiment 2 of the present invention.

Alternatively, as shown in FIG. 10, the row address decoder 2 may be substituted with a row address decoder 14 that is configured to output a result of logical multiplication of a command decode signal ACT, which is obtained by decoding an external command, and a row address signal.

Figure 11:
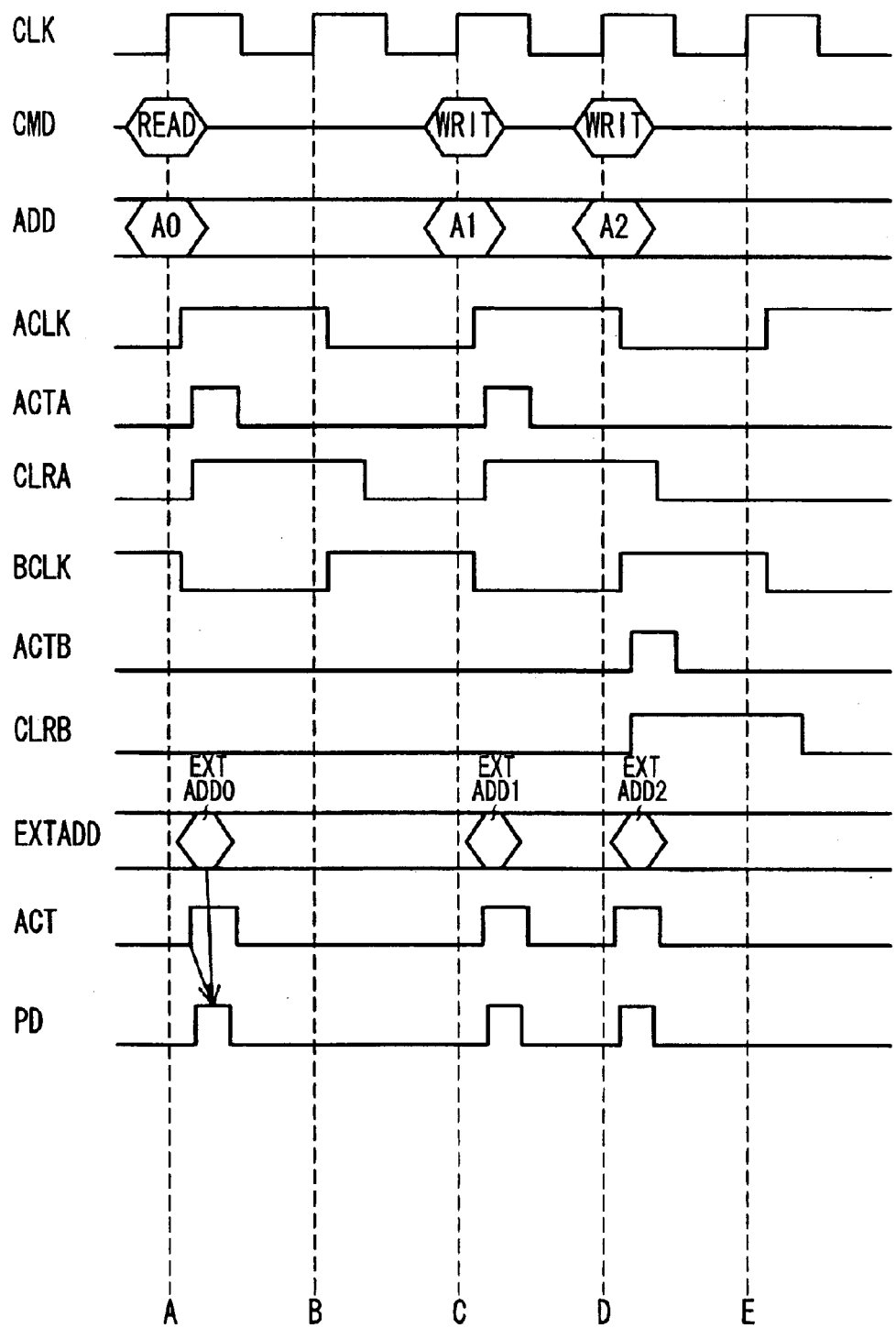
FIG. 11 is a timing chart showing the main configuration of the semiconductor memory device according to Embodiment 2 of the present invention.

As for the semiconductor memory device with this configuration, the following mainly describes a row address decoding operation by the same, with reference to FIG. 11.

With reference to FIG. 11, in cycle A, data in an address A0 is read out in response to the input of an external command READ and an external address A0. Relating to this procedure, a reference signal for controlling the internal two ports according to the frequency-division period is ACLK and BCLK generated in the frequency-division clock generation circuit 11, where ACLK is used for the control in cycle A.

A control signal for controlling the ACLK and a command READ for reading-out, which is decoded by the command decoder, is ACTA, and the control signal ACTA functions as a control signal for latching an address in the A-port address latch circuit 3.

Next, the external address signal A0 input from an external pad ADD is buffered in the address buffer 7 and is decoded in the row address decoder 14. In this process, an address signal is determined as a result of logical multiplication with a logical OR signal ACT of the control signals ACTA and ACTB generated in the command decoder. Thereby, when the address signal EXADD0 is in a high state and only during a time period determined as a result of logical multiplication of a valid time period of EXTADD0 and an activated time period of the control signal ACT, the address decode signal PD is activated in a high state.

Next, the address decode signal PD is latched in the address latch circuit 3 by the control signal ACTA to be rendered into an address latch signal PDWA so as to activate a desired A-port memory cell transistor.

As described above, Embodiment 2 is effective for reducing a layout area, because the address decode signal PD can be fixed in a low state during an address invalid time period without arranging the latch circuit 12 having a large size. In addition, when an external command is not input, a precharge of the address decode signal PD can be fixed in a low state, whereby power consumption during the standby mode can be reduced.

Embodiment 3

Figure 12:
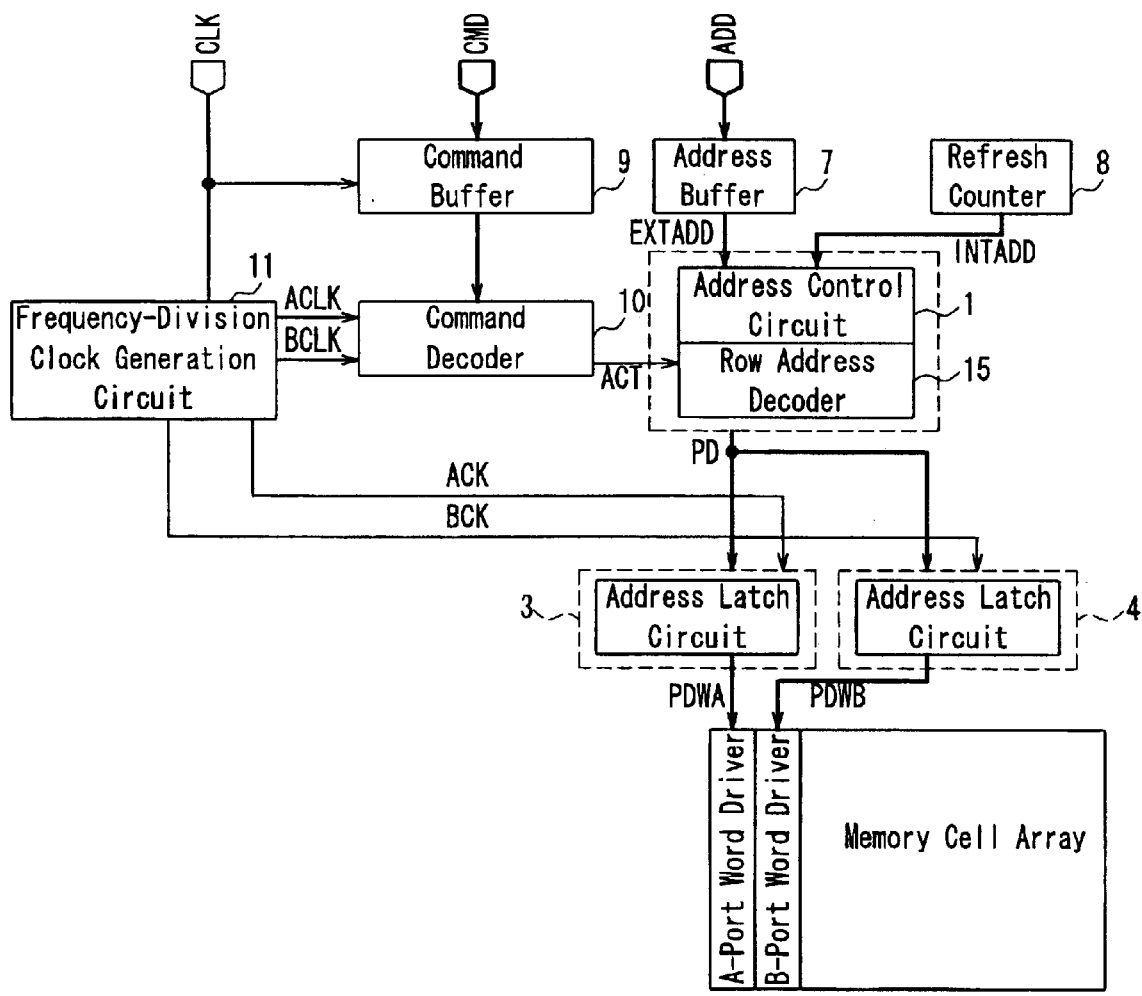
FIG. 12 is a block diagram showing a main configuration of the semiconductor memory device according to Embodiment 3 of the present invention.

The following describes a semiconductor device according to Embodiment 3 of the present invention, with reference to the drawings. FIG. 12 is a block diagram showing a main configuration of the semiconductor memory device according to Embodiment 3 of the present invention. The following mainly describes a row address decoding operation by the same, with reference to FIG. 13.

Figure 13:
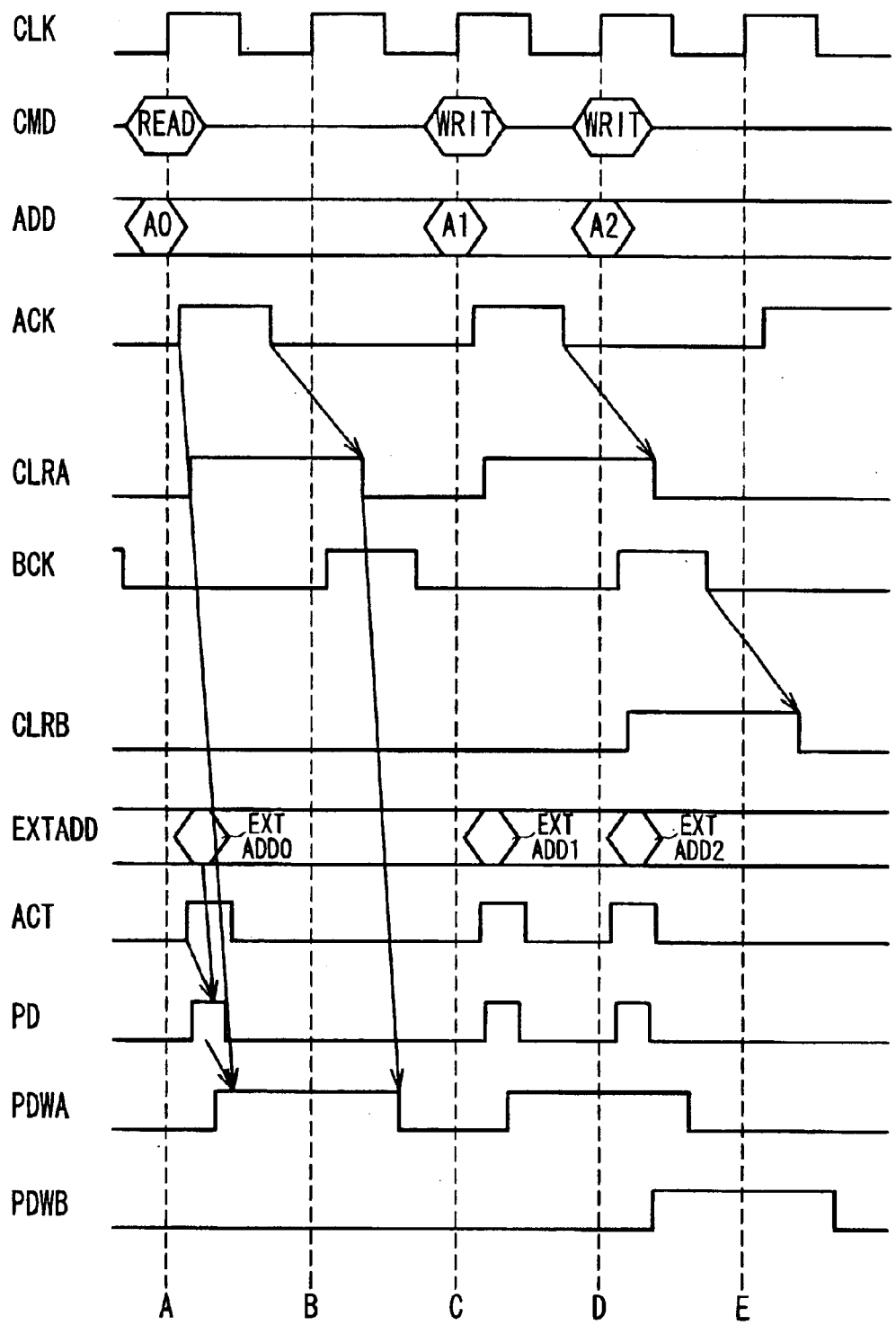
FIG. 13 is a timing chart showing the main configuration of the semiconductor memory device according to Embodiment 3 of the present invention.
Figure 14:
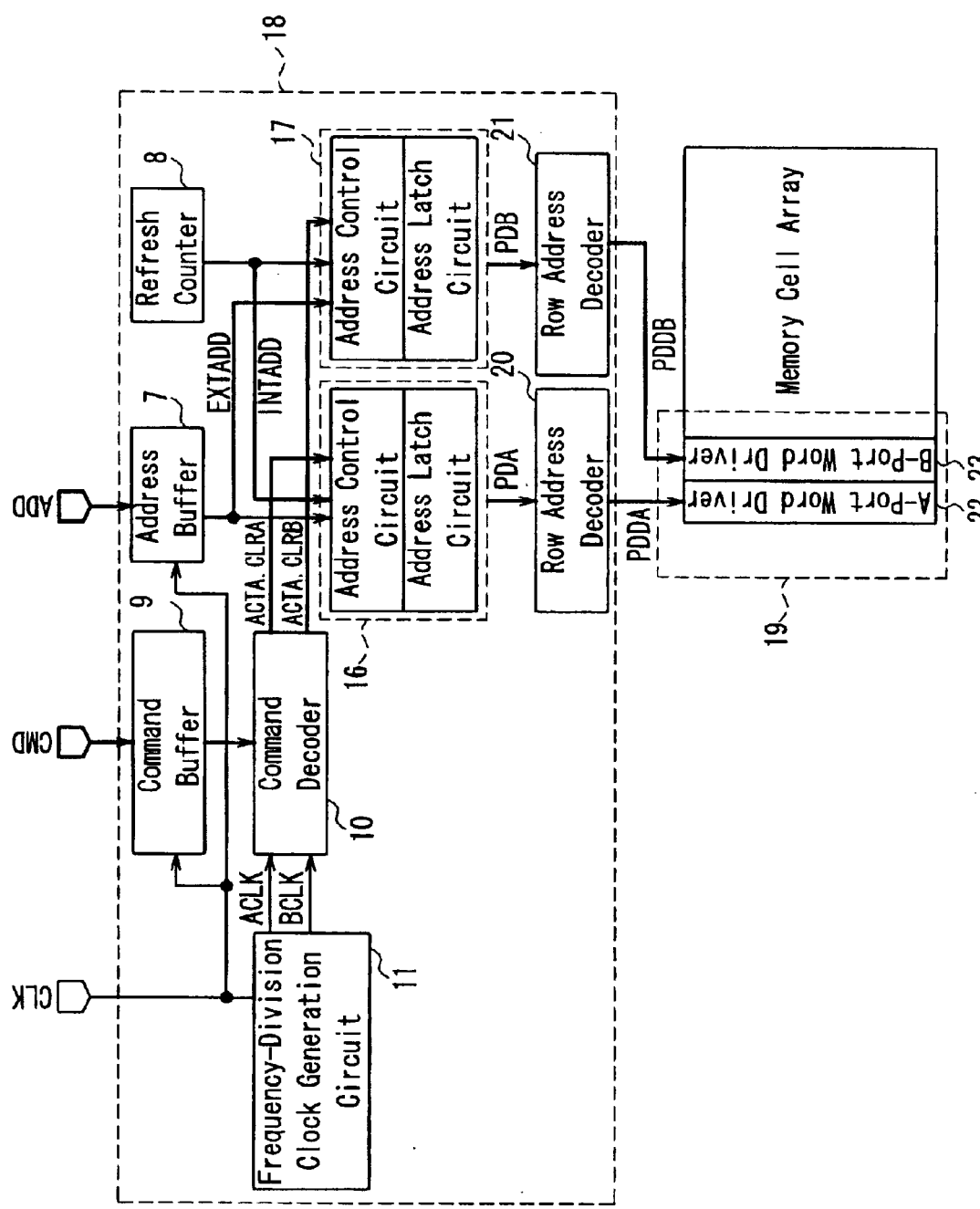
FIG. 14 is a block diagram showing a main configuration of the conventional semiconductor memory device.
Figure 15:
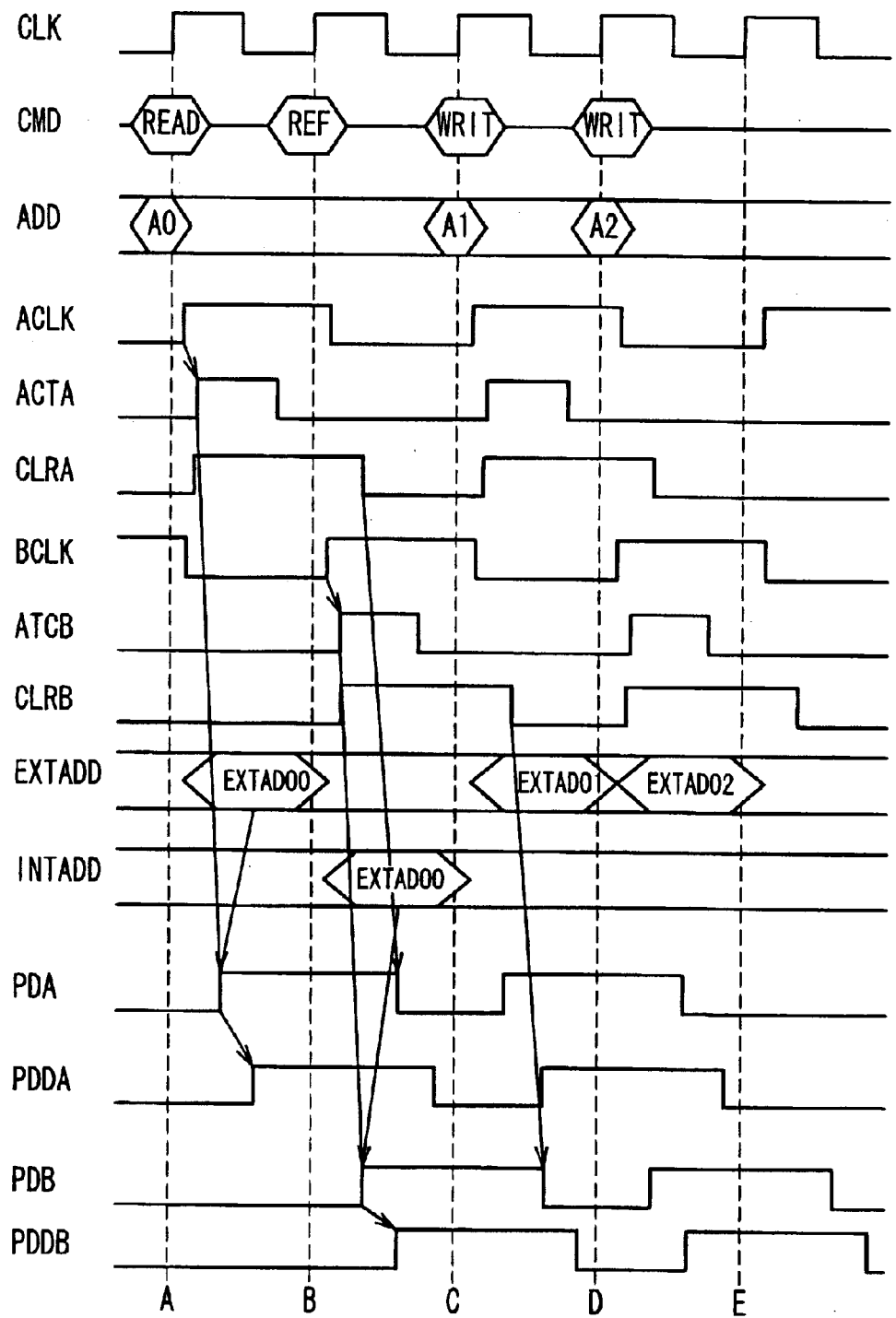
FIG. 15 is a timing chart showing the main configuration of the conventional semiconductor memory device.
Figure 16:
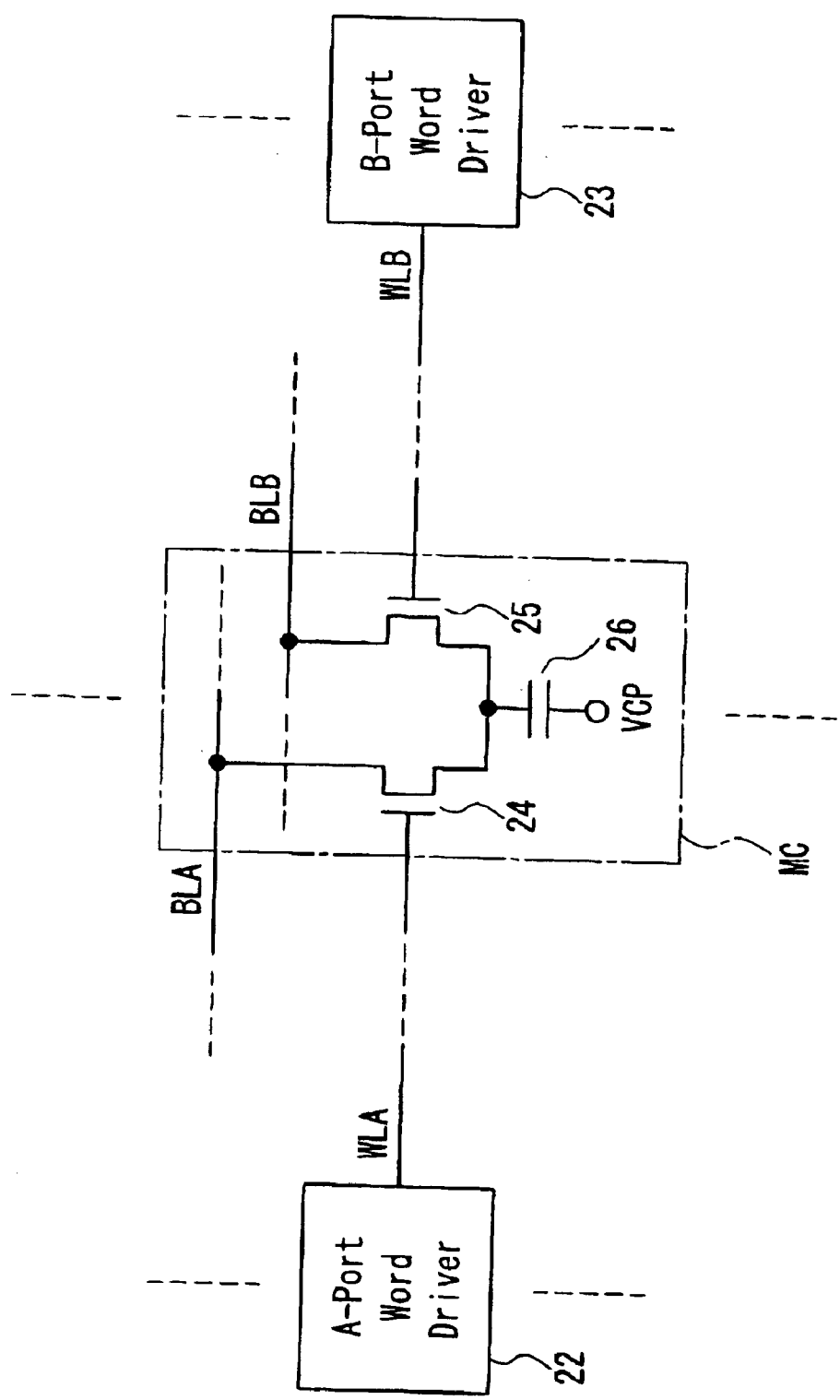
FIG. 16 is a schematic diagram showing a memory cell and word drivers.

In FIG. 13, in cycle A, data in an address A0 is read out in response to the input of an external command READ and an external address A0. Relating to this procedure, a reference signal for controlling the internal two ports according to the frequency-division period is ACK and BCK generated in the frequency-division clock generation circuit 11, where ACK is used for the control in cycle A. This ACK signal functions as a latch control signal in the address latch circuit 3.

Next, the external address signal A0 input from an external pad ADD is buffered in the address buffer 7 and is decoded in the row address decoder 15. In this process, an address signal is determined as a result of logical multiplication with the command decode signal ACT generated in the command decoder. Thereby, when the address signal EXADD0 is in a high state and only during a time period in the valid time period of EXTADD0 and the activated time period of the command decode signal ACT when the result of logical multiplication of both signals is in a high state, the address decode signal PD is activated in a high state.

Next, the address decode signal PD is latched in the address latch circuit 3 by the ACK signal to be rendered into an address latch signal PDWA so as to activate a desired A-port memory cell transistor.

In the following cycles C and D, the same row address decoding operation is conducted.

As stated above, inside of the peripheral circuit in which timing can be adjusted easily because of the relatively small influence of the timing delay and the interference, a valid period for an address to be activated can be controlled using the command decode signal ACT and the address signal. In addition, as a latch control signal in the address latch circuits 3 and 4 included in the row-decoder that is susceptible to the delay and disorder in the signal transmission due to the influence of a wiring load and the interference noise, a signal only for allocating into the frequency-division signals ACK and BCK of the external clock that can contain the address valid time period is used. These configurations can provide enough latching timing, and therefore a circuit with less latch error can be realized.

Also, when compared with Embodiments 1 and 2, the circuit operation can be simplified and the layout area can be reduced because the configuration according to this embodiment can eliminate the generation of the control signals ACTA and ACTB.

As stated above, according to the present invention, in a semiconductor memory device that has a memory cell configured with two transistors and one capacitor for the purpose of a high-speed random operation by two-port accessing the two transistors in an interleave operation mode, an address is decoded before the latching of an input address, and when latching the address, frequency-division into two-ports is conducted. As a result, a random access operation can be speeded up and reduction in the layout area and reduction of power consumption can be realized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device comprising:
    a memory cell comprising two transistors and one capacitor;
    two word drivers for controlling two word lines alternately, the two word lines controlling reading/writing with respect to the memory cell;
    two address latch circuits for latching a first address signal to select the two word drivers, the two address latch circuits being respectively provided upstream from the two word drivers; and
    an address decoder for decoding a second address signal to generate the first address signal,
    wherein the address decoder supplies the first address signal in common to both of the two address latch circuits.

2. The semiconductor memory device according to claim 1, wherein the two address latch circuits are placed in a row decoder block in which the two word drivers are arranged with a fixed interval from the memory cell.

3. The semiconductor memory device according to claim 2, wherein a control signal for controlling execution of latching by the two address latch circuits is determined as a result of logical multiplication of an internal signal for executing an external command and a control signal obtained from frequency-division of an external clock signal for controlling two ports of the semiconductor memory device alternately.

4. The semiconductor memory device according to claim 3, wherein a control signal for controlling execution of latching by the two address latch circuits is determined as a result of logical multiplication of the internal signal for executing an external command, the control signal obtained from frequency-division of an external clock signal for controlling two ports of the semiconductor memory device alternately and an address decode signal indicating a memory cell block in an array of the memory cell.

5. The semiconductor memory device according to claim 3, wherein the control signal for controlling execution of latching by the two address latch circuits is input into the address latch circuits, which are divided corresponding to a memory cell block.

6. The semiconductor memory device according to claim 3, further comprising a timing adjustment circuit in the row decoder block in which the address latch circuits are placed, the timing adjustment circuit being provided for the control signal for controlling execution of latching by the two address latch circuits and provided for every specific number of memory cell blocks.

7. The semiconductor memory device according to claim 3, further comprising a latch circuit provided between the address decoder and the two address latch circuits, wherein the latch circuit latches the first address signal during a time period only when the external dock signal is in a high state.

8. The semiconductor memory device according to claim 7, wherein the latch circuit further comprises a function for resetting the first address signal during a time period when the external clock signal is in a low state.

9. The semiconductor memory device according to claim 3, wherein, in the address decoder, an address decode signal is determined as a result of logical multiplication with a control signal for controlling latching by the address latch circuits.

10. The semiconductor memory device according to claim 2,
    wherein, in the address decoder, the first address signal is determined as a result of logical multiplication with an internal signal for executing an external command, and
    a control signal for controlling execution of latching by the address latch circuits is determined as a result of logical multiplication with a control signal obtained from frequency-division of an external clock signal for controlling two ports of the semiconductor memory device alternately.

* * * * *